US012808926B2

(12) United States Patent
Hastings et al.

(10) Patent No.: US 12,808,926 B2
(45) Date of Patent: Nov. 24, 2026

(54) TEST INTERCONNECT TEMPERATURE CONTROL WITH GAS FLOW

(71) Applicant: Essai, Inc., San Jose, CA (US)

(72) Inventors: James Ray Hastings, Chandler, AZ (US); Karthik Ranganathan, Lake Forest, CA (US); Joe E. Koeth, Murrieta, CA (US); Ethan Jeffrey Calvario Castillo, Anaheim, CA (US)

(73) Assignee: Essai, Inc., San Jose, CA (US)

( * ) Notice: Subject to any disclaimer, the term of this patent is extended or adjusted under 35 U.S.C. 154(b) by 153 days.

(21) Appl. No.: 18/799,912

(22) Filed: Aug. 9, 2024

(65) Prior Publication Data

US 2026/0002985 A1 Jan. 1, 2026

Related U.S. Application Data

(60) Provisional application No. 63/665,208, filed on Jun. 27, 2024.

(51) Int. Cl.
*G01R 31/28* (2006.01)
*G01R 1/04* (2006.01)

(52) U.S. Cl.
CPC ....... *G01R 31/2877* (2013.01); *G01R 1/0458* (2013.01)

(58) Field of Classification Search
CPC .............. G01R 31/2877; G01R 1/0458; G01R 31/2874; G01R 1/06722; G01R 1/073; G01R 31/2862; G01R 31/2863; G01R 31/2889; G01R 31/2896
USPC ..................................................... 324/750.08
See application file for complete search history.

(56) References Cited

U.S. PATENT DOCUMENTS

| | | | | |
|---|---|---|---|---|
| 5,166,606 A * | 11/1992 | Blanz | G01R 31/2831 | 324/750.04 |
| 5,205,132 A | 4/1993 | Fu | | |
| 5,459,408 A * | 10/1995 | Chen | G01R 31/2863 | 324/750.08 |
| 6,888,363 B1 * | 5/2005 | Bolde | G01R 31/2891 | 324/750.08 |
| 6,993,922 B2 | 2/2006 | Wall et al. | | |
| 7,870,800 B2 * | 1/2011 | Di Stefano | G01R 31/2877 | 73/866.5 |

(Continued)

FOREIGN PATENT DOCUMENTS

| | | |
|---|---|---|
| CN | 110954806 A | 4/2020 |
| CN | 111308305 A | 6/2020 |

(Continued)

OTHER PUBLICATIONS

Translation of KR 2024/0090377 (Year: 2024).*

(Continued)

*Primary Examiner* — Christopher P Mcandrew
(74) *Attorney, Agent, or Firm* — Squire Patton Boggs LLP; Sarah Mirza

(57) ABSTRACT

Various embodiments include techniques for controlling temperature of a test socket in a test system. A temperature controller determines an input temperature associated with a reference device under test (DUT) mounted in the test socket. The temperature controller determines a flow rate of a gas based on the input temperature. The temperature controller adjusts a flow control valve to supply the gas to the reference DUT at the flow rate.

23 Claims, 11 Drawing Sheets

(56) References Cited

U.S. PATENT DOCUMENTS

| | | | |
|---|---|---|---|
| 11,774,486 B2 | 10/2023 | Tustaniwskyj et al. | |
| 2006/0164111 A1 | 7/2006 | Lopez et al. | |
| 2007/0252610 A1* | 11/2007 | Audette | G01R 31/2874 324/750.08 |
| 2009/0261852 A1 | 10/2009 | Earle et al. | |
| 2012/0154934 A1 | 6/2012 | Wadell et al. | |
| 2014/0125367 A1* | 5/2014 | Kirby | G01R 31/2862 324/750.08 |
| 2017/0092553 A1* | 3/2017 | Okada | G01R 1/06755 |
| 2017/0139002 A1* | 5/2017 | Okada | G01R 31/2874 |
| 2023/0197485 A1* | 6/2023 | Hwang | G06T 7/0004 382/149 |
| 2023/0296667 A1 | 9/2023 | Rangnathan et al. | |
| 2023/0400506 A1 | 12/2023 | Ouyang et al. | |
| 2024/0003967 A1 | 1/2024 | Kabbani et al. | |

FOREIGN PATENT DOCUMENTS

| | | |
|---|---|---|
| JP | 2007-012475 A | 1/2007 |
| KR | 10-2000-0035699 A | 6/2000 |
| KR | 2003-0063407 A | 7/2003 |
| KR | 10-2024-0090377 A | 6/2024 |
| TW | 202338376 A | 10/2023 |
| TW | 202403322 A | 1/2024 |
| WO | 2017/039936 A1 | 3/2017 |
| WO | 2023/084613 A1 | 5/2023 |
| WO | 2024/018536 A1 | 1/2024 |

OTHER PUBLICATIONS

Flex-TC, "Benchtop Temperature Forcing System For Thermal Cycling Of Dut's From -55° C. To +155° C.", Mechanical Devices, Oct. 2015, 48 pages.

Laczewski et al., "Flexible Temperature Control Solution for Integrated Circuits Testing-Silicon Creations Thermal Elephant", https://doi.org/10.3390/electronics11223766, vol. 11, Article 3766, Nov. 16, 2022, pp. 1-10.

Office Action received for Korean Application No. 10-2025-0050606 dated Nov. 25, 2025, 19 pages.

Search Report received for Taiwanese Application No. 114106520 dated Jan. 27, 2026, 3 pages.

* cited by examiner

TEST INTERCONNECT TEMPERATURE CONTROL WITH GAS FLOW

CROSS-REFERENCE TO RELATED APPLICATIONS

This application claims the benefit of the United States Provisional Patent Application titled, "TEST INTERCONNECT TEMPERATURE CONTROL WITH AIRFLOW," filed on Jun. 27, 2024 and having Ser. No. 63/665,208. The subject matter of this related application is hereby incorporated herein by reference.

BACKGROUND

Field of the Various Embodiments

Various embodiments relate generally to integrated circuit manufacturing and test and, more specifically, to a test interconnect temperature control with gas flow.

Description of the Related Art

Test systems for testing one or more integrated circuits, multichip modules, and/or the like can exhibit one or more limitations. First, during testing, especially with a new product and test program, the temperature at certain localized areas of a device under test (DUT), referred to as a reference DUT, can exceed the melting point of the solder balls mounted to the reference DUT and/or the maximum operating temperature of the interconnect that transmits signals to and receives signals from the reference DUT. Under such conditions, the solder balls can begin to melt and deform. As a result, the reference DUT can adhere to components of the test system, causing damage to the reference DUT and/or the test system. Repairing such damage can be time consuming and expensive. Second, the base die junction temperature can be difficult to control in stacked package-on-package (POP) packages from a top-side thermal control unit since the stacked component can interrupt conduction to the die below the top surface.

Third, certain conventional test sockets do not have a convenient mechanism to determine if the temperature of a reference DUT is nearing the solder melting point during a test procedure. Further, although a test system can be fitted with a conventional temperature measurement device, the test socket that holds the reference DUT during the test procedure would need to be redesigned in order to accommodate the temperature measurement device. In some cases, existing test signal probes that transmit electrical signals to and from the reference DUT and/or monitor such electrical signals may have to increase in size and/or length in order to fit in a redesigned test socket that includes such a large temperature measurement device.

As the foregoing illustrates, what is needed in the art are more effective techniques for controlling temperature in a test interconnect.

SUMMARY

Various embodiments of the present disclosure set forth a test socket. The test socket comprises at least one probe cartridge that is in contact with a channel. The test socket further comprises a probe field comprising a plurality of test spring probes that are at least partially disposed within the channel. The test socket further comprises an inlet configured to introduce a gas into the channel. The test socket further comprises an outlet configured to exhaust the gas away from the channel. The gas cools at least a portion of the plurality of test spring probes included in the probe field.

Other embodiments include, without limitation, a system that implements one or more aspects of the disclosed techniques, and one or more computer readable media including instructions for performing one or more aspects of the disclosed techniques, as well as a method for performing one or more aspects of the disclosed techniques.

At least one technical advantage of the disclosed techniques relative to the prior art is that, with the disclosed techniques, a closed loop temperature control continuously monitors the spring probe temperature and/or DUT temperature and adjusts the flow of gas to a test socket that contains a reference DUT in order to maintain a desired temperature of the reference DUT. In addition, a test system can use the same spring probe as deployed in conventional systems, and avoid the need for a specially manufactured spring probe, such as a longer spring probe, that may not fit into existing test systems. Further, the disclosed solution can be fitted to and integrated with existing gas connections, test systems, and test handlers commonly found in testing environments. These advantages represent one or more technological improvements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

Various embodiments of the disclosed techniques include a test socket, fitted with standard spring probes, that has a modified design such that a channel is formed between the upper and lower housing of the test socket through which a gas, such as compressed dry air (CDA), flows. This channel can expose the entire field of spring probes to a stream of gas. Alternatively, a selected portion of the spring probes can be exposed to the stream of gas while other spring probes are not exposed to the stream of gas. This approach to expose only a selected portion of the spring probes to the stream of gas can be for various purposes, such as maintaining a consistent impedance along the path of the spring probes carrying high-speed signals. This test socket is designed with connection points for a gas supply, and either an exhaust port to the environment or a connection point to route the exhaust to a preferred discharge location.

One configuration can supply the gas to the test socket through alignment pins that are normally used to ensure that the thermal head and/or hand-socket lid is precisely located and seated on the test socket. Each of these alignment pins can have an axially oriented hole disposed along the main axis, and a sealing mechanism added to the alignment pins in the test socket to prevent leakage of the gas. One alignment pin can connect to the supply side of the internal socket gas flow passages while the other alignment pin can connect to the exhaust side. The discharge could also be routed to a port on the socket frame if this flow does not need to be moved away from the area. Another method can be to utilize purge gas coming in from a thermal head condensation abatement chamber, which seals around the top of the socket when the thermal head is fully engaged. CDA is supplied into this enclosed chamber and sealed volume. Further, a portion of the CDA is diverted to an inlet port in the test socket frame, also located inside the sealed area. This configuration can cause the purge gas to flow through the test socket channels and then be exhausted either directly out of a port located outside the sealed area or through tubing and one or more manifolds to other test sockets. Some embodiments provide novel ways to connect a gas supply and/or a gas exhaust to the test socket that can simplify integration into a test handler or hand-socket lid.

In the following description, numerous specific details are set forth to provide a more thorough understanding of the various embodiments. However, it will be apparent to one skilled in the art that the inventive concepts may be practiced without one or more of these specific details.

System Overview

Figure 1:
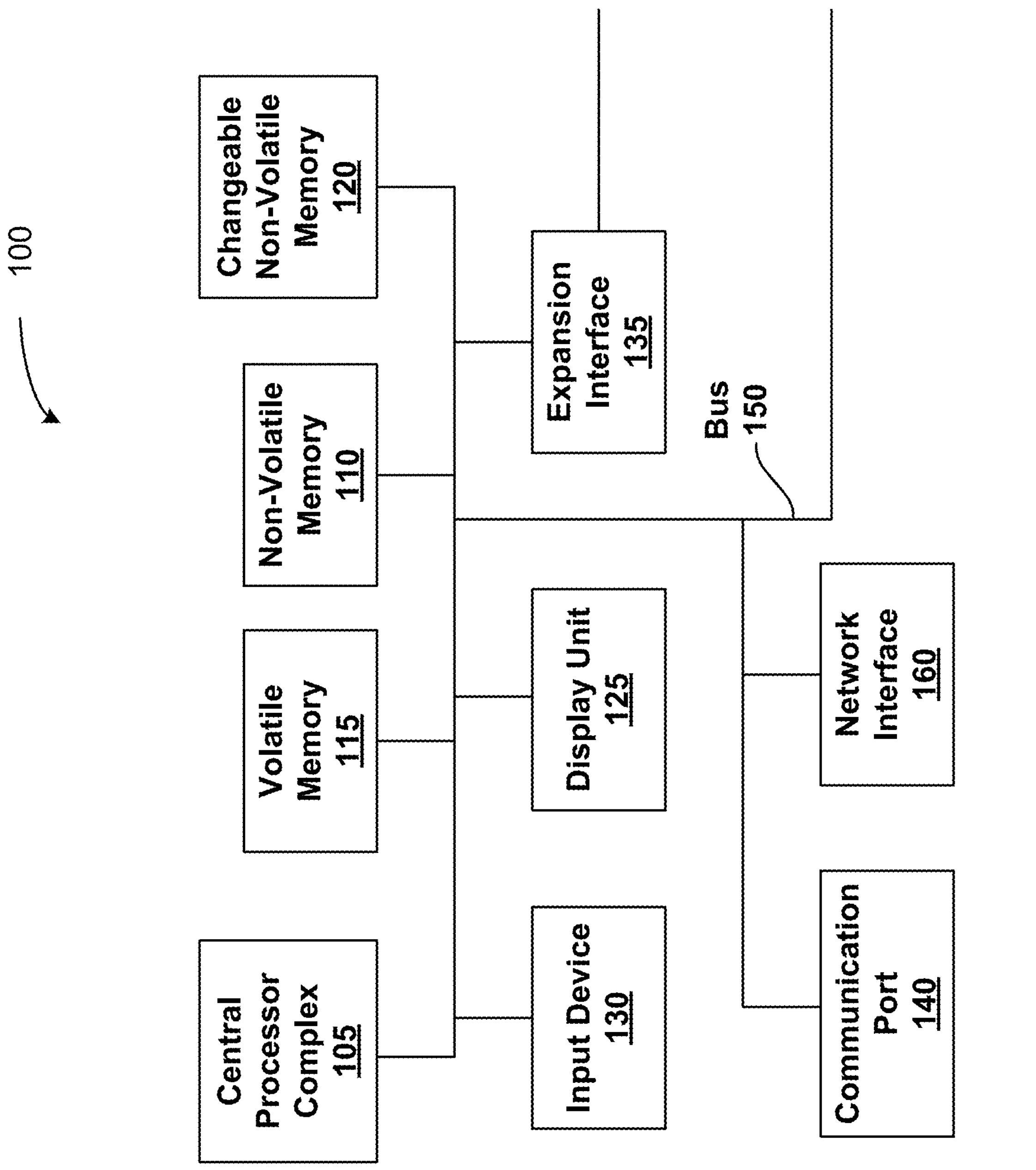
FIG. 1 is a block diagram illustrating a computing system, which can be used as a platform and/or as control system configured to implement one or more aspects of the various embodiments.

FIG. 1 is a block diagram illustrating a computing system 100, which can be used as a platform and/or as control system configured to implement one or more aspects of the various embodiments. As shown, computing system 100 can be a "server" computer system, in some embodiments. Computing system 100 includes an address/data bus 150 for communicating information, a central processor complex 105 functionally coupled with a bus 150 for processing information and instructions. Bus 150 can comprise, for example, a Peripheral Component Interconnect Express (PCIe) computer expansion bus, industry standard architecture (ISA), extended ISA (EISA), MicroChannel, Multibus, Institute of Electrical and Electronics Engineers (IEEE) 796, IEEE 1196, IEEE 1496, PCI, Computer Automated Measurement and Control (CAMAC), MBus, Runway bus, Compute Express Link (CXL), and the like.

Central processor complex 105 can comprise a single processor or multiple processors, e.g., a multi-core processor, or multiple separate processors, in some embodiments. Central processor complex 105 can comprise various types of well-known processors in any combination, including, without limitation, digital signal processors (DSPs), graphics processors (GPUs), complex instruction set (CISC) processors, reduced instruction set (RISC) processors, very long word instruction set (VLIW) processors, and/or the like. Computing system 100 can also include a volatile memory 115 (e.g., random access memory RAM) coupled with the bus 150 for storing information and instructions for the central processor complex 105, and a non-volatile memory 110 (e.g., read only memory ROM) coupled with the bus 150 for storing static information and instructions for the central processor complex 105. Computing system 100 optionally includes a changeable, non-volatile memory 120 (e.g., NOR flash memory) for storing information and instructions for the central processor complex 105 which can be updated after the manufacture of computing system 100. In some embodiments, only one of non-volatile memory 110 or changeable, non-volatile memory 120 may be present.

Also included in computing system 100 of FIG. 1 is an optional input device 130. Input device 130 can communicate information and command selections to the central processor complex 105. Input device 130 can be any suitable device for communicating information and/or commands to the computing system 100. For example, input device 130 can take the form of a keyboard, buttons, a joystick, a track ball, an audio transducer, e.g., a microphone, a touch sensitive digitizer panel, eyeball scanner, and/or the like.

Computing system 100 can comprise a display unit 125. Display unit 125 can comprise a liquid crystal display (LCD) device, cathode ray tube (CRT), field emission device (FED, also called flat panel CRT), light emitting diode (LED), plasma display device, electro-luminescent (EL) display, electronic paper, electronic ink (e-ink), and/or other display device suitable for creating graphic images and/or alphanumeric characters recognizable to the user. Display unit 125 can have an associated lighting device, in some embodiments.

Computing system 100 also optionally includes an expansion interface 135 coupled with the bus 150. Expansion interface 135 can implement many well-known standard expansion interfaces, including, without limitation, the Secure Digital Card interface, universal serial bus (USB) interface, Compact Flash, Personal Computer (PC) Card interface, CardBus, Peripheral Component Interconnect (PCI) interface, Peripheral Component Interconnect Express (PCI Express), mini-PCI interface, IEEE 8394, Small Computer System Interface (SCSI), Personal Computer Memory Card International Association (PCMCIA) interface, Industry Standard Architecture (ISA) interface, RS-232 interface, and/or the like. In some embodiments of the present disclosure, expansion interface 135 can comprise signals substantially compliant with the signals of bus 150.

A wide variety of well-known devices can be attached to computing system 100 via the bus 150 and/or expansion interface 135. Examples of such devices include without limitation rotating magnetic memory devices, flash memory devices, digital cameras, wireless communication modules, digital audio players, and Global Positioning System (GPS) devices.

Computing system 100 also optionally includes a communication port 140. Communication port 140 can be implemented as part of expansion interface 135. When implemented as a separate interface, communication port 140 can typically be used to exchange information with other devices via communication-oriented data transfer protocols. Examples of communication ports include without limitation RS-232 ports, universal asynchronous receiver transmitters (UARTs), USB ports, infrared light transceivers, ethernet ports, IEEE 8394, and synchronous ports.

Computing system 100 optionally includes a network interface 160, which can implement a wired or wireless network interface. Computing system 100 can comprise additional software and/or hardware features (not shown), in some embodiments.

Figure 2:
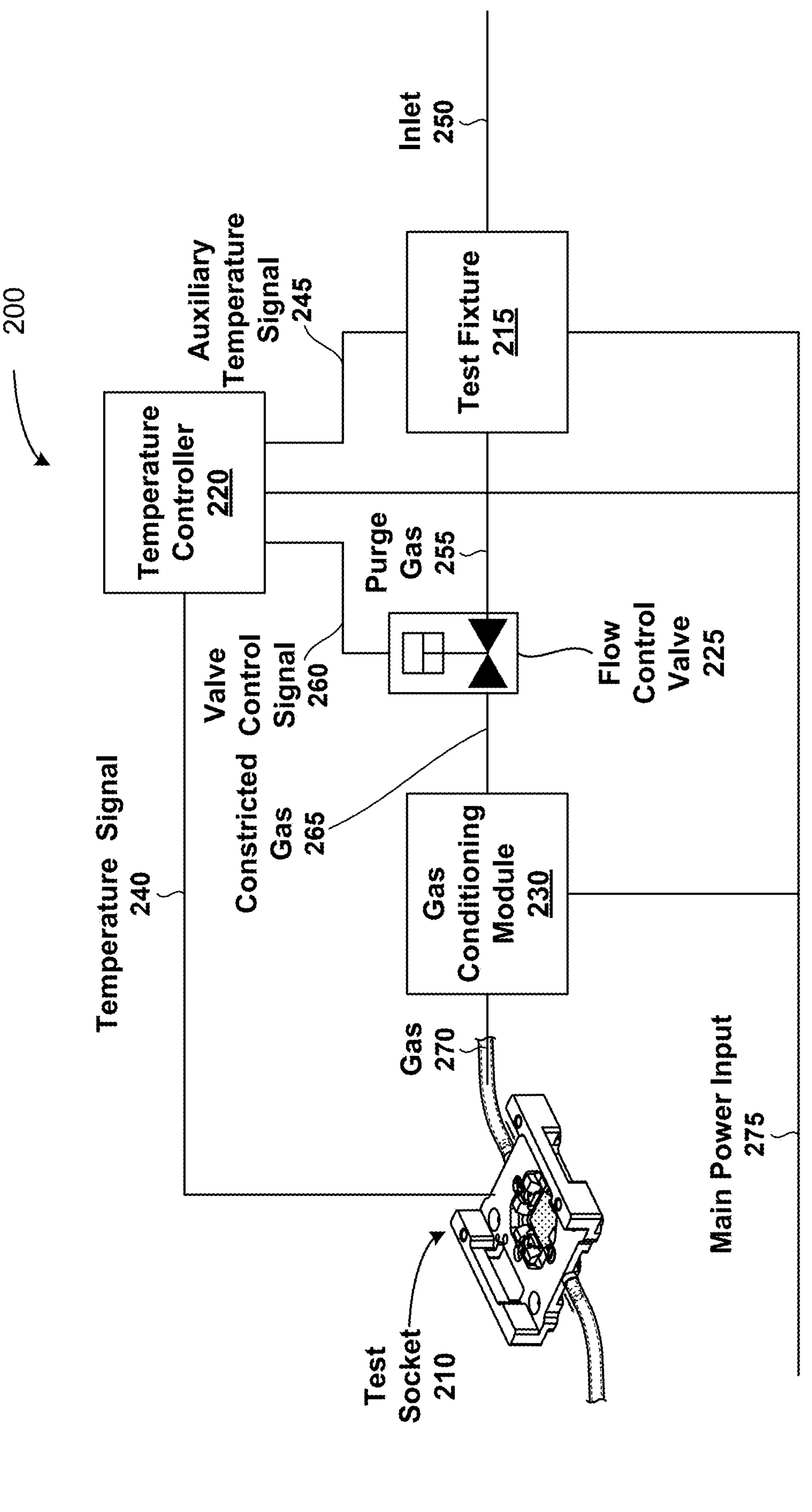
FIG. 2 is a block diagram illustrating a test system included in the computing system of FIG. 1, according to various embodiments.

FIG. 2 is a block diagram illustrating a test system 200 included in the computing system 100 of FIG. 1, according to various embodiments. Test system 200 includes, without limitation, a test socket 210, a test fixture 215, a temperature controller 220, a flow control valve 225, and a gas conditioning module 230. Test system 200, and/or any components thereof, can be implemented on one or more computing systems, such as computing system 100 of FIG. 1. Certain components of test system 200 can receive an alternating current (AC) and/or direct current (DC) power supply via main power input 275. As shown, such components can include, without limitation, test fixture 215, temperature controller 220, gas conditioning module 230, and/or any one or more other components of test system 200.

Test socket 210 is configured to receive a reference DUT for testing. Prior to testing, a user can mount the reference DUT to the test socket 210. The test socket 210 receives gas 270 from gas conditioning module 230. As described herein, a probe field included in test socket 210 is exposed to gas 270. Gas 270 cools spring probes within the probe field to reduce the likelihood of melting of solder balls mounted to the reference DUT. Partially and/or fully melted solder balls can cause damage to the reference DUT and/or to test socket 210, can cause spring probes to adhere to the solder balls, can prevent removal of the reference DUT after testing, and/or the like. Such conditions can lead to costly repairs of the reference DUT and/or test socket 210. In some embodiments, gas 270 can further provide condensation abatement for the spring probes when the temperature of the spring probes, reference DUT, and/or the like fall below the ambient dewpoint. Test socket 210 can be fitted with a temperature measurement device that measures a temperature of the reference DUT and/or test socket 210. Test socket 210 transmits the measured temperature, as a temperature signal 240, to temperature controller 220. In some embodiments, test socket 210, or any portion thereof, can comprise a material that has a substantially high thermal conductivity, typically greater than 10 watts per meter Kelvin (W/m*K), and a substantially low electrical conductivity, typically less than $10^{e-6}$ microsiemens per centimeter (μS/cm).

Test fixture 215 tests the functionality of the reference DUT coupled (e.g., mounted) to test socket 210 by performing one or more testing operations on the reference DUT. In various embodiments, test socket 210 can be fixedly attached or removably attached to test fixture 215. In some embodiments, test fixture 215 comprises a tester that includes one or more fixedly attached test sockets, such as test socket 210. In such embodiments, gas 270 can be supplied to and/or exhausted from the one or more test sockets via fixed connections. In some embodiments, test fixture 215 comprises a test handler that includes one or more test sockets, such as test socket 210, mounted to a test interface board that is removably attached to test system 200. In such embodiments, gas 270 can be supplied to and/or exhausted from the one or more test sockets 210 via a connection that includes a quick-disconnect mechanism. Test fixture 215 can be fitted with one or more temperature measurement devices that measure a temperature associated with the reference DUT and/or test socket 210. Test fixture 215 transmits the measured temperature, as an auxiliary temperature signal 245, to temperature controller 220.

Further, test fixture 215 includes an inlet 250 that receives a gas from an external source. The gas can be compressed dry air (CDA), uncompressed dry air, compressed or uncompressed nitrogen, and/or the like. Test fixture 215 passes at least a portion of the incoming gas as purge gas 255 to flow control valve 225. Test fixture 215 can further direct a portion of purge gas 255 to a reference load board (not shown in FIG. 2) for various purposes.

Temperature controller 220 provides a closed-loop temperature control for test system 200. Temperature controller 220 receives a temperature signal 240 from one or more temperature measurement devices included in test socket 210. Similarly, temperature controller 220 receives an auxiliary temperature signal 245 from one or more temperature measurement devices included in test fixture 215. The one or more temperature measurement devices that supply temperature data to temperature signal 240 and/or auxiliary temperature signal 245 can measure the temperature of a solder ball of the reference DUT, a junction temperature of the reference DUT, a package temperature and/or surface temperature of the reference DUT, a temperature of a thermal head or pedestal coupled to the reference DUT, and/or the like. Based on temperature signal 240 and/or auxiliary temperature signal 245, temperature controller 220 determines an input temperature associated with the reference DUT. Temperature controller 220 determines a flow rate of a gas, such as purge gas 255, based on the input temperature. Temperature controller 220 transmits a valve control signal 260 to flow control valve 225. By transmitting the valve control signal 260 to flow control valve 225, temperature controller 220 adjusts flow control valve 225 to supply at least a portion of purge gas 255 to gas conditioning module 230 as constricted gas 265. Gas conditioning module 230, in turn, supplies at least a portion of constricted gas 265 to the reference DUT mounted in test socket 210 as gas 270.

Flow control valve 225 restricts gas flow to constrict and/or control the amount of purge gas 255 that passes through flow control valve 225 as constricted gas 265. The amount of constricted gas 265 is based on valve control signal 260 received from temperature controller 220. Flow control valve 225 can constrict and/or control the flow of purge gas 255 via any technically feasible mechanism for controlling gas flow, such as a solenoid, a motor, a diaphragm, a piston, a hydraulic control, and/or the like. After constricting and/or controlling the amount of purge gas 255, flow control valve 225 supplies purge gas 255 to gas conditioning module 230 as constricted gas 265.

Gas conditioning module 230 receives constricted gas 265 from flow control valve 225 and can adjust the temperature and/or humidity of received constricted gas 265. After adjusting the temperature and/or humidity of constricted gas 265, gas conditioning module 230 supplies constricted gas 265 to test socket 210 as gas 270. In some embodiments, gas conditioning module 230 can decrease the temperature of gas 270 to enhance the cooling effect of gas 270 when flowing through test socket 210. Additionally and/or alternatively, gas conditioning module 230 can increase or decrease the temperature of gas 270 to reach a desired testing temperature for the reference DUT mounted in test socket 210. For example, gas conditioning module 230 can increase the temperature of gas 270 to compensate for heat loss resulting from a thermal head (not shown in FIG. 2) that draws heat away from the reference DUT when mounted in test socket 210. Further, gas conditioning module 230 can adjust the temperature of gas 270 to compensate for heat gain and/or heat loss caused by a reference DUT that has a package-on-package (POP) configuration.

In some embodiments, gas conditioning module 230 can decrease the humidity of gas 270 if gas 270 is not sufficiently dry. Similarly, gas conditioning module 230 can increase the humidity of gas 270 if humidified gas flowing through test socket 210 is desirable. In some examples, adjusting the humidity of gas 270 can impact the cooling effect of gas 270 on the spring probes included in test socket 210.

In some embodiments, gas conditioning module 230 can adjust the temperature of gas 270 based on a temperature control signal (not shown) received from temperature controller 220. Similarly, in some embodiments, gas conditioning module 230 can adjust the humidity of gas 270 based on a humidity control signal (not shown) received from temperature controller 220. After adjusting the temperature and/or humidity, gas conditioning module 230 supplies gas 270 to test socket 210.

Figure 3:
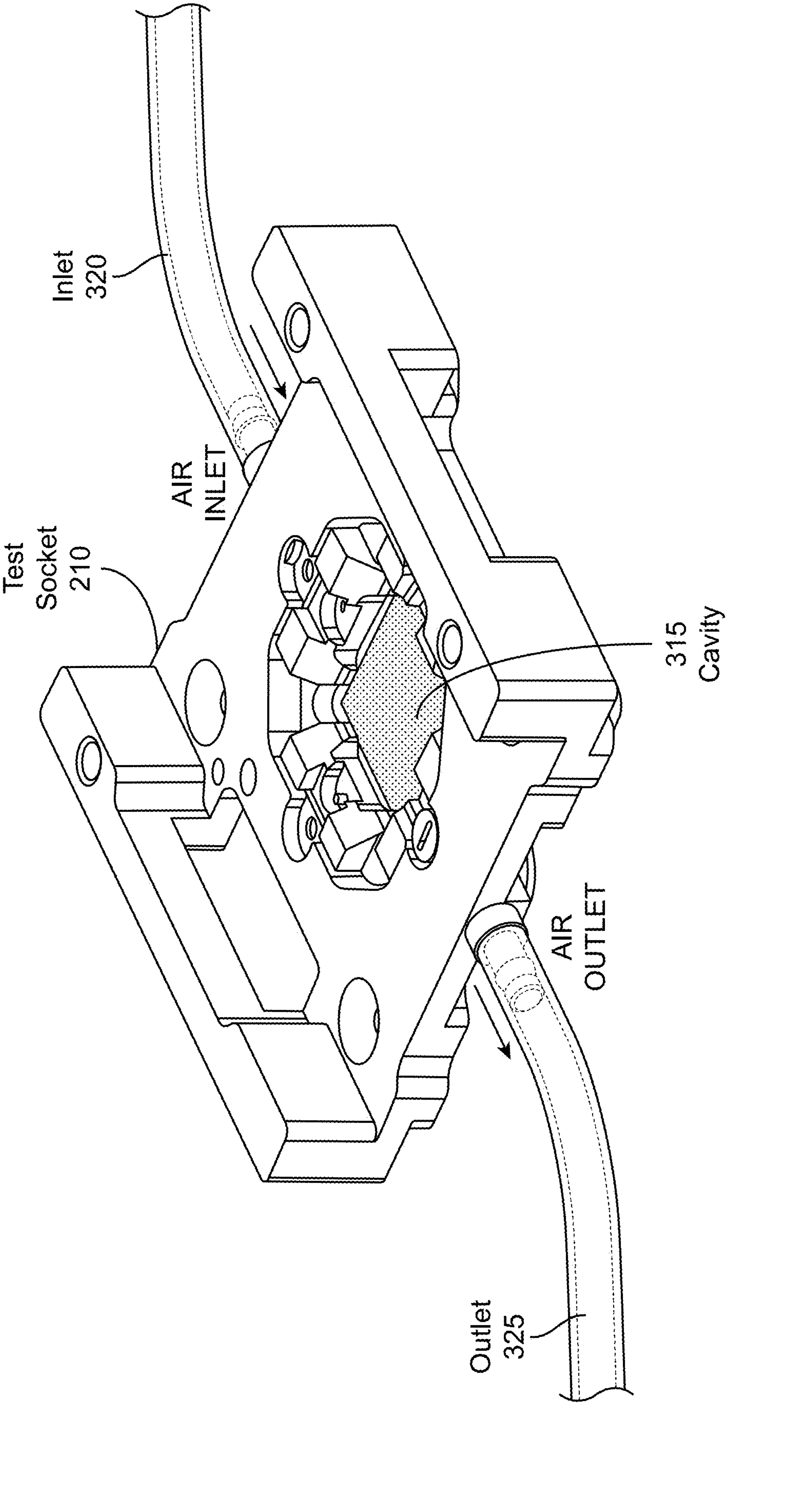
FIG. 3 is a more detailed view of the test socket included in the test system of FIG. 2, according to various embodiments.

FIG. 3 is a more detailed view of the test socket 210 included in the test system 200 of FIG. 2, according to various embodiments. As shown, test socket 210 includes an inlet 320 that receives gas 270 from gas conditioning module 230 of FIG. 2. In some embodiments, inlet 320 receives a gas 270 that has been compressed prior to being supplied to test socket 210. In some embodiments, inlet 320 can be directly coupled or indirectly coupled to an air compressor and/or other gas compression device (not shown). Such compressed gas, air compressor, and/or other gas compression device can actively push the gas 270 from inlet 320 through test socket 210. Gas 270 flows from inlet 320 and through a cavity 315 of test socket 210. As gas 270 flows through cavity 315, gas 270 cools the spring probes in the probe field of test socket 210. After flowing across cavity 315, gas 270 is exhausted through outlet 325. Additionally or alternatively, after flowing across cavity 315, gas 270 is exhausted directly to the surrounding environment. In some embodiments, outlet 325 can be directly coupled or indirectly coupled to a vacuum pump and/or other vacuum device (not shown). Such a vacuum pump and/or other vacuum device can actively pull the remaining gas from outlet 325 of test socket 210.

Figure 4:
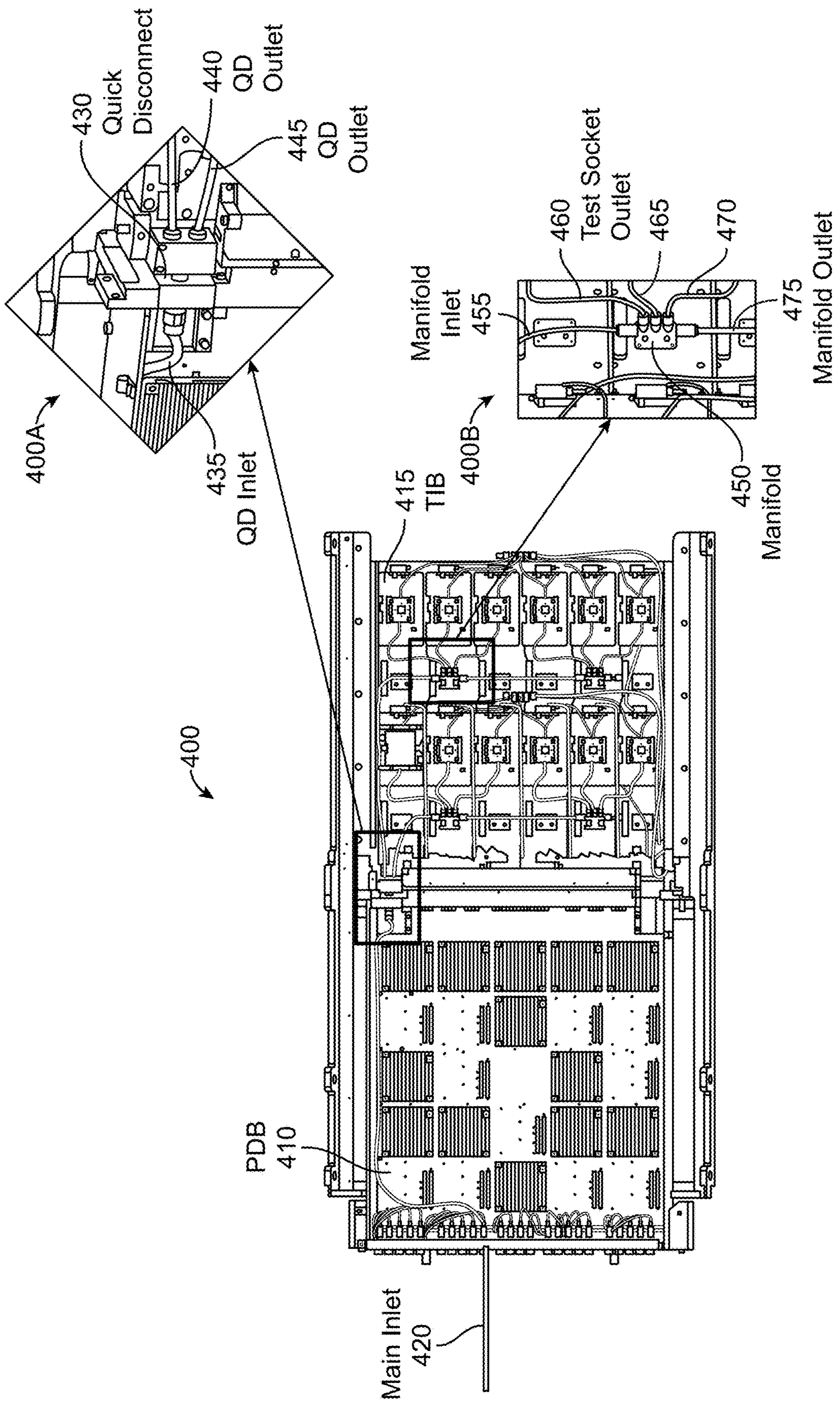
FIG. 4 illustrates a test handler included in the test system of FIG. 2, according to various embodiments.

FIG. 4 illustrates a test handler 400 included in the test system 200 of FIG. 2, according to various embodiments. As shown, test handler 400 includes, without limitation, a power distribution board (PDB) 410 and a test interface board (TIB) 415. Test handler 400 can be included in test fixture 215 of test system 200 of FIG. 2. Power distribution board 410 can be fixedly attached to test fixture 215 while test interface board 415 can be removably attached to test fixture 215. When test interface board 415 is attached to test fixture 215, test interface board 415 is coupled to power distribution board 410. Prior to performing a test procedure, test interface board 415 can be attached to power distribution board 410 and, when the test procedure completes, test interface board 415 can be detached from power distribution board 410. Test handler 400 can include an automated placement machine (not shown) that can automatically attach test interface board 415 to and/or detach test interface board 415 from power distribution board 410. Additionally or alternatively, a user can manually attach test interface board 415 to and/or detach test interface board 415 from power distribution board 410.

Power distribution board 410 provides electrical power to test interface board 415 to provide power during the test procedure. Power distribution board 410 further provides a gas to test interface board 415 during the test procedure via main inlet 420. As shown in inset 400A, main inlet 420 provides the gas to a quick disconnect (QD) inlet 435 on power distribution board 410. The gas transits through a quick disconnect 430 between power distribution board 410 and test interface board 415. After transiting through quick disconnect 430, the gas is distributed to various locations on test interface board 415 via one or more quick disconnect outlets, such as quick disconnect (QD) outlet 440 and/or quick disconnect (QD) outlet 445.

Quick disconnect 430 can be a blind-mate quick disconnect without any latching mechanism. Such a blind-mate quick disconnect can make a gas connection between power distribution board 410 and test interface board 415 as test interface board 415 is automatically or manually inserted into test handler 400, locked into place, and mated to power distribution board 410. In some embodiments, the gas can automatically flow from quick disconnect inlet 435 to quick disconnect outlet 440 and/or quick disconnect outlet 445 through quick disconnect 430 when test interface board 415 is attached to power distribution board 410. Similarly, in such embodiments, the gas can automatically stop flowing from quick disconnect inlet 435 to quick disconnect outlet 440 and/or quick disconnect outlet 445 through quick disconnect 430 when test interface board 415 is detached from power distribution board 410.

As shown in inset 400B, test interface board 415 can include one or more manifolds, such as manifold 450, that route the gas from quick disconnect outlet 440 and/or quick disconnect outlet 445 to one or more test sockets 210 mounted on test interface board 415. Manifold 450 receives the gas from quick disconnect outlet 440 via a manifold inlet 455. Manifold 450 distributes a first portion of the gas to one or more test sockets 210 coupled to manifold 450. Manifold 450 can distribute some of the gas to test sockets 210 coupled to test socket outlet 460. Further, manifold 450 can distribute some of the gas to test sockets 210 coupled to test socket outlet 465. Further, manifold 450 can distribute some of the gas to test sockets 210 coupled to test socket outlet 470. In addition, manifold 450 distributes a second portion of the gas to one or more manifolds downstream of manifold 450 via a gas tight conduit coupled to manifold outlet 475. When the gas exits the most downstream manifold 450, any remaining gas can transit through the manifold outlet 475 to be exhausted to the surrounding environment and/or recovered by a gas collection module (not shown). As described in conjunction with FIG. 3, manifold outlet 475 of the most downstream manifold 450 and/or outlets of a most downstream test socket 210 in any branch of test interface board 415 can be coupled to a vacuum pump and/or other vacuum device (not shown). Such a vacuum pump and/or other vacuum device can actively pull the gas from manifold outlets 475 of manifolds 450 and/or outlets of test sockets 210 as needed. In this manner, incoming gas from a main inlet 420 can flow through a quick disconnect 430 and through one or more manifolds 450 to distribute the incoming gas to multiple test sockets 210 mounted on test interface board 415.

Figure 5:
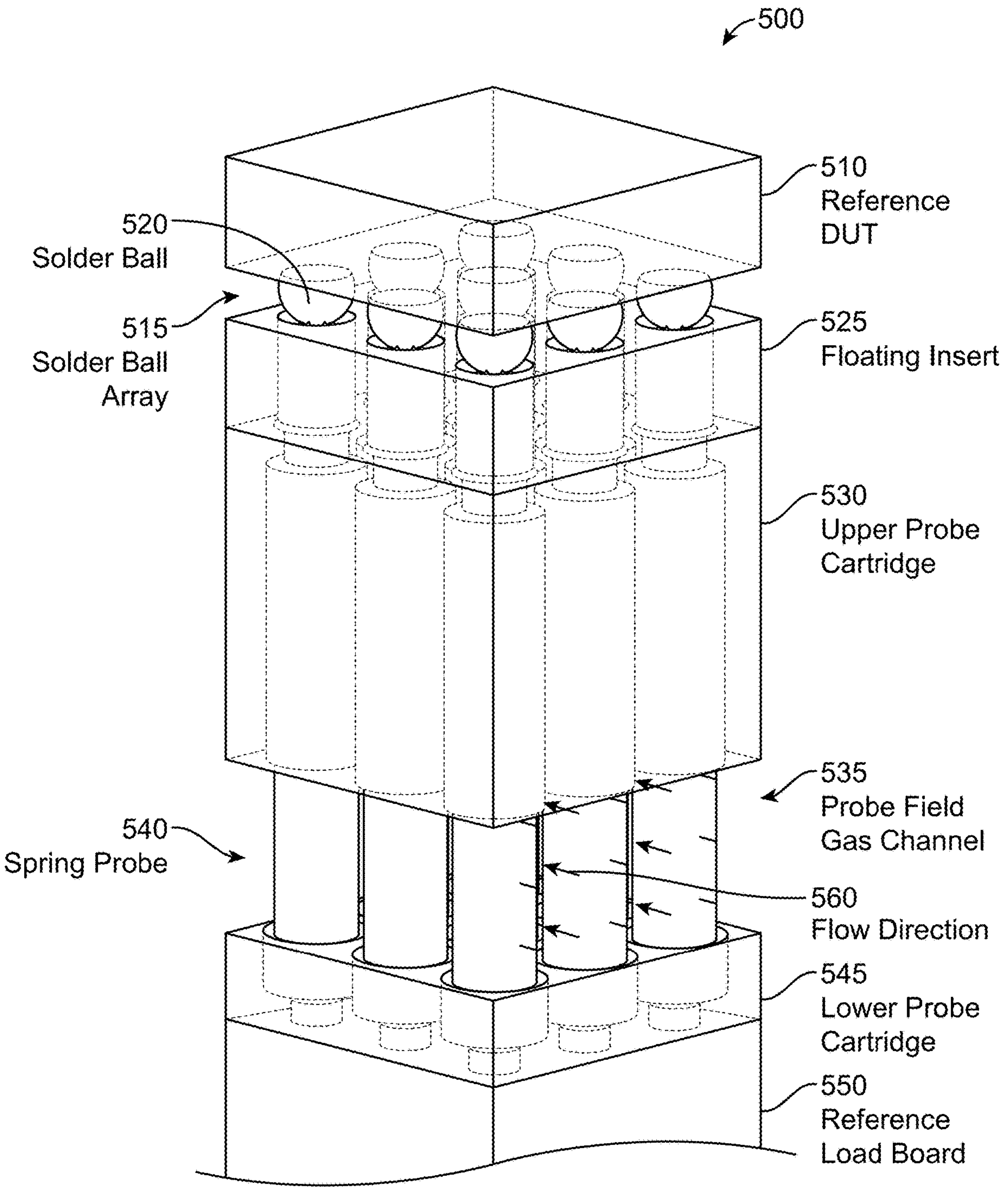
FIG. 5 is a three-quarter cross-sectional view of a section of the test socket when mounted in the test system of FIG. 2, according to various embodiments.

FIG. 5 is a three-quarter cross-sectional view 500 of a section of the test socket 210 when mounted in the test system 200 of FIG. 2, according to various embodiments. As shown in the three-quarter cross-sectional view 500, solder balls 520 are configured in a solder ball array 515 and mounted to the lower surface of a reference DUT 510.

A probe field includes multiple spring probes 540 that can contract and/or expand to make contact with solder balls 520 of solder ball array 515. Likewise, spring probes 540 can contract and/or expand to make contact with signal traces on reference load board 550. In this manner, spring probes 540 can carry signals, power supply voltage, and/or ground connection between reference DUT 510 and reference load board 550.

Floating insert 525 aligns spring probes 540 to make electrical contact, mechanical contact, and/or thermal contact between spring probes 540 and corresponding solder balls 520. Spring probes 540 are disposed within a probe cartridge that includes an upper probe cartridge 530 and a lower probe cartridge 545. A gap between upper probe cartridge 530 and lower probe cartridge 545 forms a probe field gas channel 535 across which flows an incoming gas.

At least a portion of the spring probes 540 in the probe field is exposed to incoming gas via probe field gas channel 535. The gas flows in a flow direction 560 across a lower portion of at least a portion of the spring probes 540 included in the probe field. The amount of exposure of the spring probes 540 to the incoming gas can be varied by adjusting the height of floating insert 525, upper probe cartridge 530, and/or lower probe cartridge 545. In general, the cooling effect of the incoming gas on the spring probes 540 varies directly with the amount of surface area of the spring probes 540 that is exposed to the incoming gas. Therefore, as the height of probe field gas channel 535 increases, the cooling effect of the incoming gas flowing across the spring probes 540 increases. Likewise, as the height of probe field gas channel 535 decreases, the cooling effect of the incoming gas flowing across the spring probes 540 decreases.

As the spring probes 540 carry signals, power, and/or ground current between reference DUT 510 and reference load board 550, the temperature of the spring probes 540 can increase. Although solder balls 520 themselves have a cooling effect on spring probes 540, the temperature rise of the spring probes 540 can nevertheless increase to near, at, or above the melting point of solder balls 520 in solder ball array 515. As a result, solder balls 520 can begin to melt, deform, and/or adhere to the top of the spring probes 540.

These conditions can damage the reference DUT 510, the spring probes 540, and/or other components of test socket 210, such as floating insert 525 and upper probe cartridge 530. To reduce or eliminate melting and/or deformation of solder balls 520, the incoming gas flows across spring probes 540 via the probe field gas channel 535. The incoming gas flowing across probe field gas channel 535 reduces the temperature of the spring probes 540 at or near the solder balls 520 to a temperature sufficiently below the solder melting point.

Figure 6:
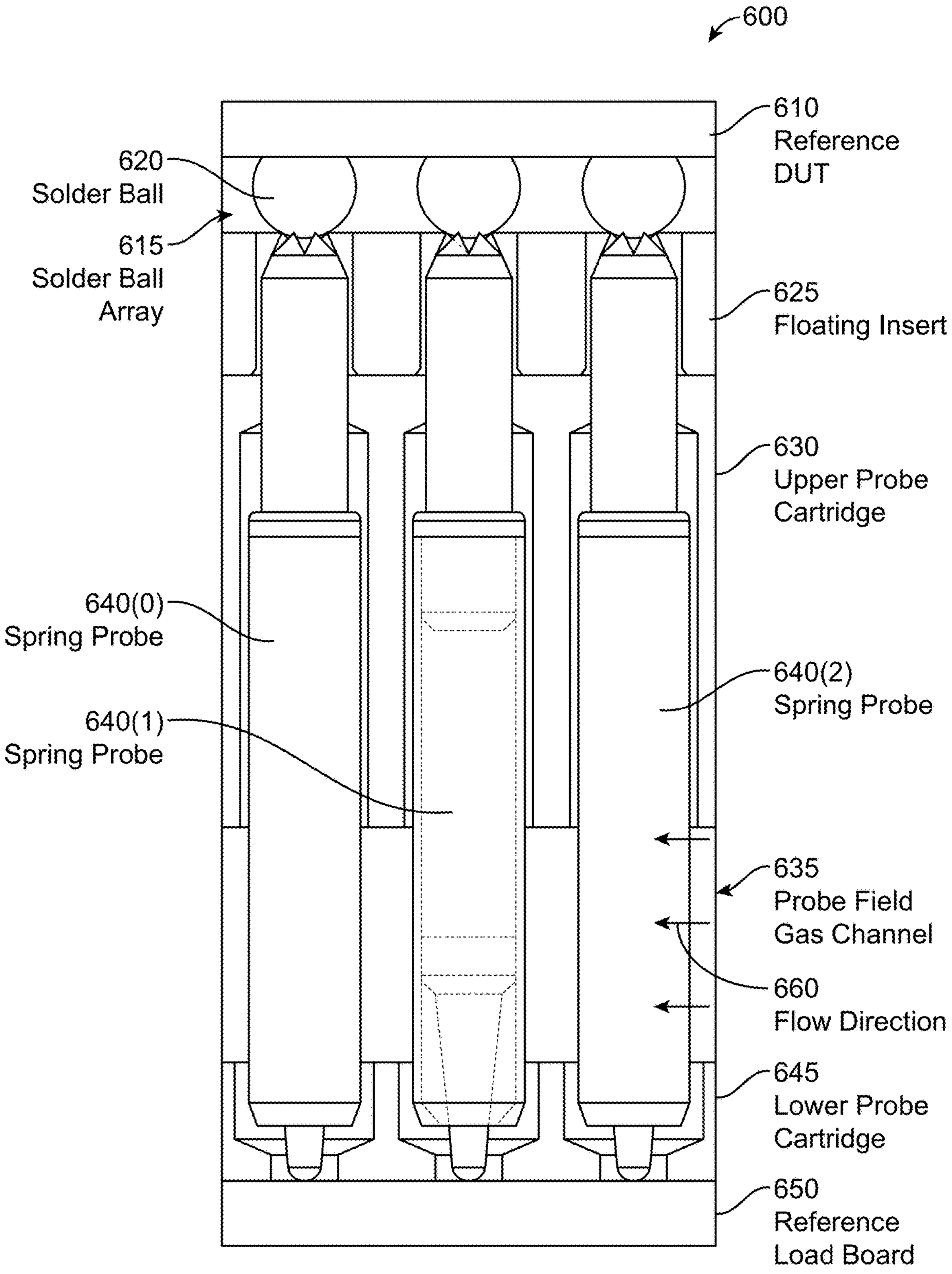
FIG. 6 is a front cross-sectional view of a section of the test socket when mounted in the test system of FIG. 2, according to various embodiments.

FIG. 6 is a front cross-sectional view 600 of a section of the test socket 210 when mounted in the test system 200 of FIG. 2, according to various embodiments. As shown in the front cross-sectional view 600, solder balls 620 are configured in a solder ball array 615 and mounted to the lower surface of a reference DUT 610.

A probe field includes multiple spring probes 640 that can contract and/or expand to make contact with solder balls 620 of solder ball array 615. Likewise, spring probes 640 can contract and/or expand to make contact with signal traces on reference load board 650. In this manner, spring probes 640 can carry signals, power supply voltage, and/or ground connection between reference DUT 610 and reference load board 650.

Floating insert 625 aligns spring probes 640 to make electrical contact, mechanical contact, and/or thermal contact between spring probes 640 and corresponding solder balls 620. Spring probes are disposed within a probe cartridge that includes an upper probe cartridge 630 and a lower probe cartridge 645. A gap between upper probe cartridge 630 and lower probe cartridge 645 forms a probe field gas channel 635 across which flows an incoming gas.

Spring probes 640(0)-640(2) in the probe field are exposed to incoming gas via probe field gas channel 635. The gas flows in a flow direction 660 across a lower portion of at least a portion of the spring probes 640(0)-640(2). The amount of exposure of the spring probes 640(0)-640(2) to the incoming gas can be varied by adjusting the height of floating insert 625, upper probe cartridge 630, and/or lower probe cartridge 645. In general, the cooling effect of the incoming gas on the spring probes 640(0)-640(2) varies directly with the amount of surface area of the spring probes 640(0)-640(2) that is exposed to the incoming gas. Therefore, as the height of probe field gas channel 635 increases, the cooling effect of the incoming gas flowing across the spring probes 640(0)-640(2) increases. Likewise, as the height of probe field gas channel 635 decreases, the cooling effect of the incoming gas flowing across the spring probes 640(0)-640(2) decreases.

As the spring probes 640(0)-640(2) carry signals, power, and/or ground current between reference DUT 610 and reference load board 650, the temperature of the spring probes 640(0)-640(2) can increase. In addition, heat generated by one spring probe 640(1) can increase the temperature of one or more adjacent spring probes 640(0), 640(2), and vice versa. Although solder balls 620 themselves have a cooling effect on spring probes 640(0)-640(2), the temperature rise of the spring probes 640(0)-640(2) can nevertheless increase to near, at, or above the melting point of solder balls 620 in solder ball array 615. As a result, solder balls 620 can begin to melt, deform, and/or adhere to the top of the spring probes 640.

These conditions can damage the reference device, the spring probes 640(0)-640(2), and/or other components of test socket 210, such as floating insert 625 and upper probe cartridge 630. To reduce or eliminate melting and/or deformation of solder balls 620, the incoming gas flows across spring probes 640(0)-640(2) via the probe field gas channel 635. The incoming gas flowing across probe field gas channel 635 reduces the temperature of the spring probes 640(0)-640(2) at or near the solder balls 620 to a temperature sufficiently below the solder melting point.

Figure 7:
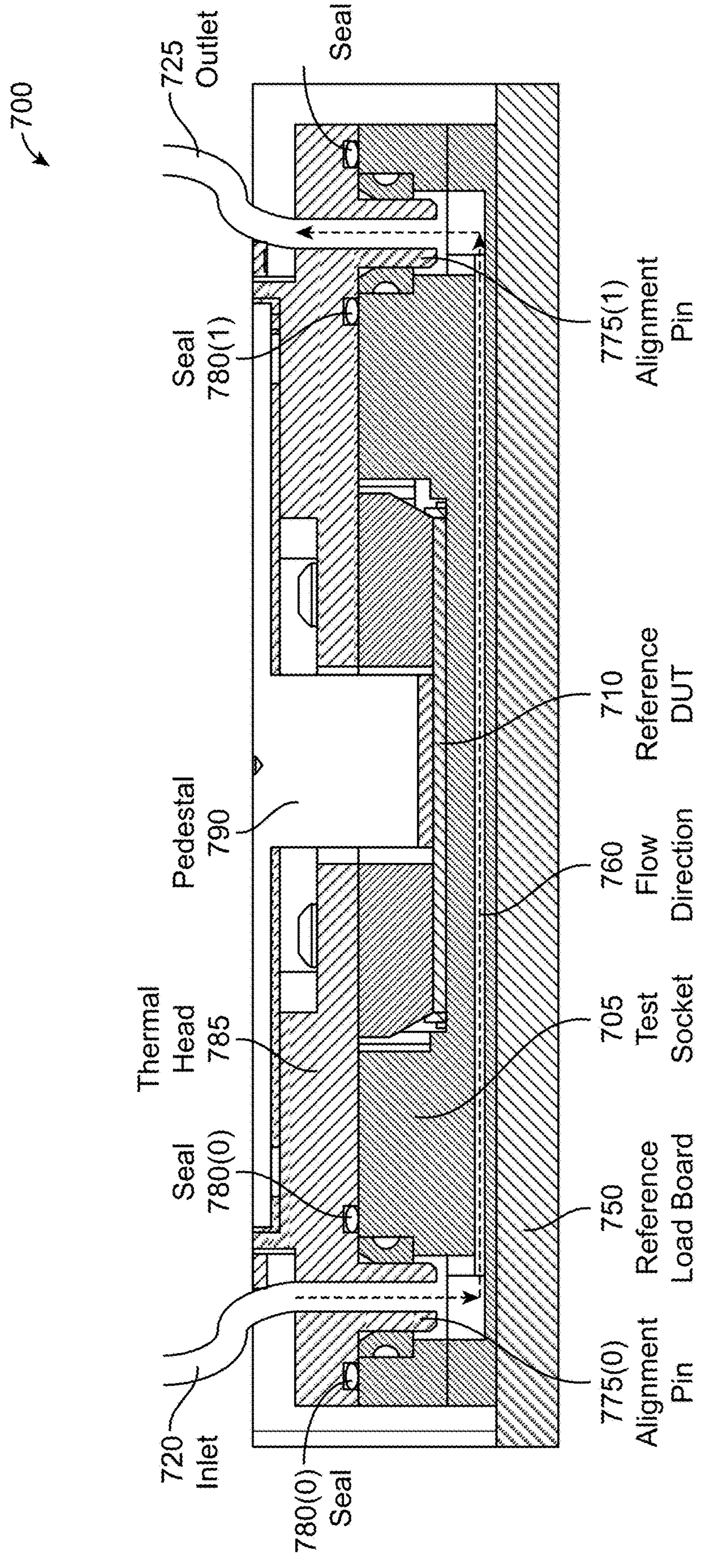
FIG. 7 illustrates a cross-sectional view of a test socket with an inlet and an outlet disposed within one or more alignment pins of the test socket, according to various embodiments.

FIG. 7 illustrates a cross-sectional view 700 of a test socket 705 with an inlet 720 and an outlet 725 disposed within one or more alignment pins 775(0)-775(1) of the test socket 705, according to various embodiments. As shown, a reference DUT 710 is mounted to a test socket 705 for testing purposes. A thermal head 785 compresses reference DUT 710 downward towards reference load board 750.

Alternatively, a hand-socket lid (HSL) (not shown) compresses reference DUT 710 downward towards reference load board 750. Thermal head 785 or hand-socket lid can conduct heat away from reference DUT 710. Thermal head 785 or hand-socket lid can include an actuator, such as a manually operated lever or, in the alternative, an actuator included in a test handler, such as test handler 400 of FIG. 4. When the actuator is engaged, thermal head 785 or hand-socket lid compresses reference DUT 710 by applying downward pressure on reference DUT 710. In some embodiments, thermal head 785 or hand-socket lid applies downward pressure on reference DUT 710 through a pedestal 790. This downward pressure helps to ensure that each spring probe (not shown in FIG. 7) makes electrical contact, mechanical contact, and/or thermal contact between a solder ball on reference DUT 710 and a corresponding electrical trace on reference load board 750.

Test socket 705 can be constructed to divide the downward pressure between downward pressure on reference DUT 710 and reference load board 750 such that neither reference DUT 710 nor reference load board 750 receive undue stress that could cause damage. In that regard, test socket 705 can include independent force mechanisms. These independent force mechanisms can include a first force mechanism that applies downward pressure on reference DUT 710 and a second force mechanism that applies downward pressure on reference load board 750. These independent force mechanisms can be configured to work with a reference DUT 710 comprising a bare die package and/or with a reference DUT 710 comprising a lidded package.

Test socket 705 includes a number of alignment pins including a first alignment pin 775(0) and a second alignment pin 775(1). Alignment pins 775 help to precisely align thermal head 785 with test socket 705. An inlet 720 supplies a gas to test socket 705 via an axially oriented hole disposed in first alignment pin 775(0). When the actuator is engaged, thermal head 785 or hand-socket lid applies downward pressure on seal 780(0) placed near the engagement area of first alignment pin 775(0) to prevent leakage or escapement of the gas at inlet 720. Likewise, an outlet 725 exhausts the gas from test socket 705 via an axially oriented hole disposed in second alignment pin 775(1). When the actuator is engaged, thermal head 785 or hand-socket lid applies downward pressure on seal 780(1) placed near the engagement area of second alignment pin 775(1) to prevent leakage or escapement of the gas at outlet 725. The gas flows from inlet 720 to outlet 725 in a flow direction 760. In some embodiments, a portion of the gas received at inlet 720 can be diverted to flow along other portions of test socket 705 and/or thermal head 785 to reduce condensation around reference DUT 710, adjust the temperature near reference DUT 710, and/or the like.

With the approach shown in FIG. 7, test socket 705 can eliminate additional gas connections that need to be engaged and/or disengaged, such as the separate inlet 320 and outlet 325 of test socket 210 shown in FIG. 3. In addition, test socket 705 can have improved serviceability and integration with test interface board 415 of FIG. 4. Further, test socket 705 can have a smaller footprint, relative to test socket 210 shown in FIG. 3.

Figure 8:
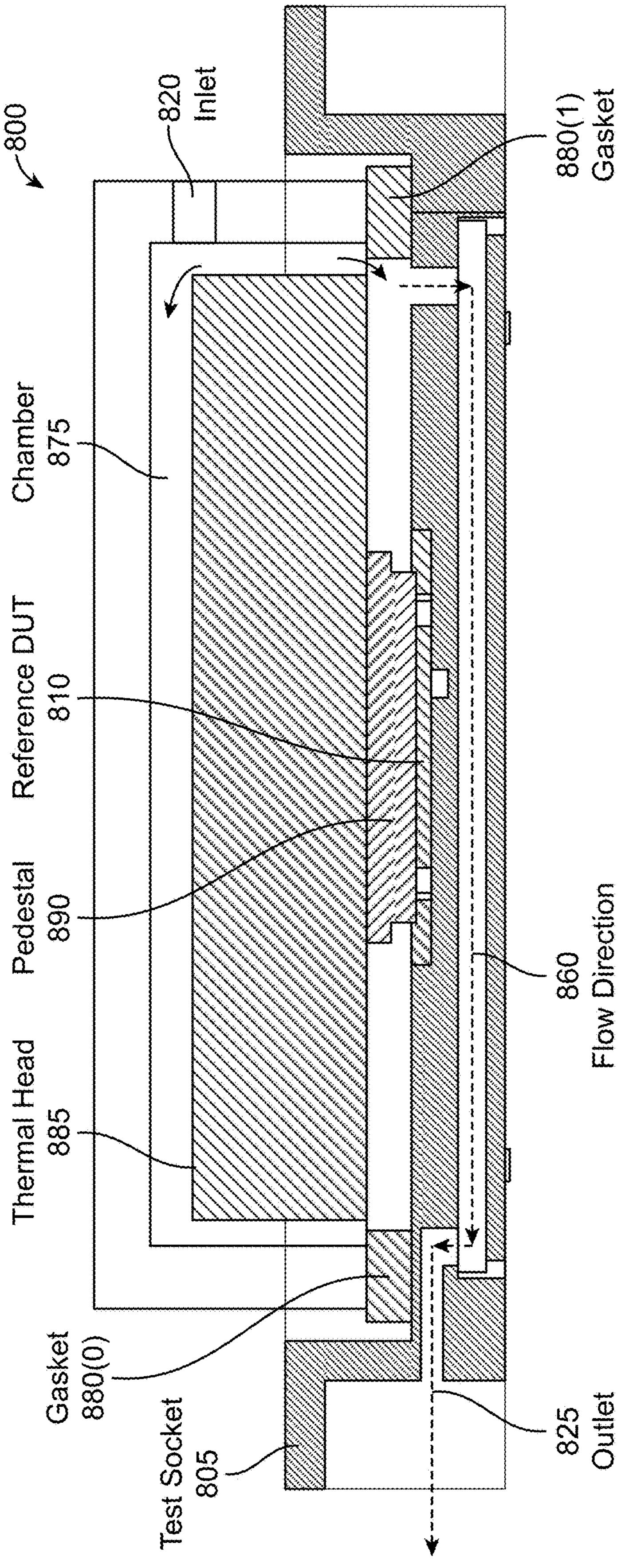
FIG. 8 illustrates a cross-sectional view of a test socket with an inlet that introduces a gas into a chamber of the test socket, according to various embodiments.

FIG. 8 illustrates a cross-sectional view 800 of a test socket 805 with an inlet 820 that introduces a gas into a chamber 875 of the test socket 805, according to various embodiments. As shown, a reference DUT 810 is mounted to a test socket 805 for testing purposes. A thermal head 885 compresses reference DUT 810 downward towards a reference load board (not shown). Alternatively, a hand-socket lid (HSL) (not shown) compresses reference DUT 810 downward towards the reference load board. Thermal head 885 or hand-socket lid can conduct heat away from reference DUT 810. Thermal head 885 or hand-socket lid can include an actuator, such as a manually operated lever or, in the alternative, an actuator included in a test handler, such as test handler 400 of FIG. 4. When the actuator is engaged, thermal head 885 or hand-socket lid compresses reference DUT 810 by applying downward pressure on reference DUT 810. In some embodiments, thermal head 885 or hand-socket lid applies downward pressure on reference DUT 810 through a pedestal 890. This downward pressure helps to ensure that each spring probe (not shown in FIG. 8) makes electrical contact, mechanical contact, and/or thermal contact between a solder ball on reference DUT 810 and a corresponding electrical trace on the reference load board.

Test socket 805 can be constructed to divide the downward pressure between downward pressure on reference DUT 810 and the reference load board such that neither reference DUT 810 nor the reference load board receive undue stress that could cause damage. In that regard, test socket 805 can include independent force mechanisms. These independent force mechanisms can include a first force mechanism that applies downward pressure on reference DUT 810 and a second force mechanism that applies downward pressure on the reference load board. These independent force mechanisms can be configured to work with a reference DUT 810 comprising a bare die package and/or with a reference DUT 810 comprising a lidded package.

Test socket 805 includes an inlet 820 that supplies an incoming gas to a chamber 875 that surrounds reference DUT 810 and thermal head 885. A portion of the gas received at inlet 820 can be diverted to flow through chamber 875 and along portions of test socket 805 and/or thermal head 885 to reduce condensation around reference DUT 810, adjust the temperature near reference DUT 810, and/or the like. When the actuator is engaged, thermal head 885 or hand-socket lid applies downward pressure on gasket 880(0) placed near the one end of test socket 805 to prevent leakage or escapement of the gas at a first end of chamber 875. Likewise, when the actuator is engaged, thermal head 885 or hand-socket lid applies downward pressure on gasket 880(1) placed near inlet 820 to prevent leakage or escapement of the gas at a second end of chamber 875. A portion of the gas is diverted to flow from inlet 820 to outlet 825 in a flow direction 860. In some embodiments, outlet 825 exhausts the gas to an exhaust port to direct and/or recover the exhaust gas. In some embodiments, outlet 825 exhausts the gas to the surrounding environment. Exhausting the gas to the surrounding environment can result in increased gas flow through chamber 875, which can lead to faster purging of high humidity gas and more effective condensation reduction.

Figure 9B:
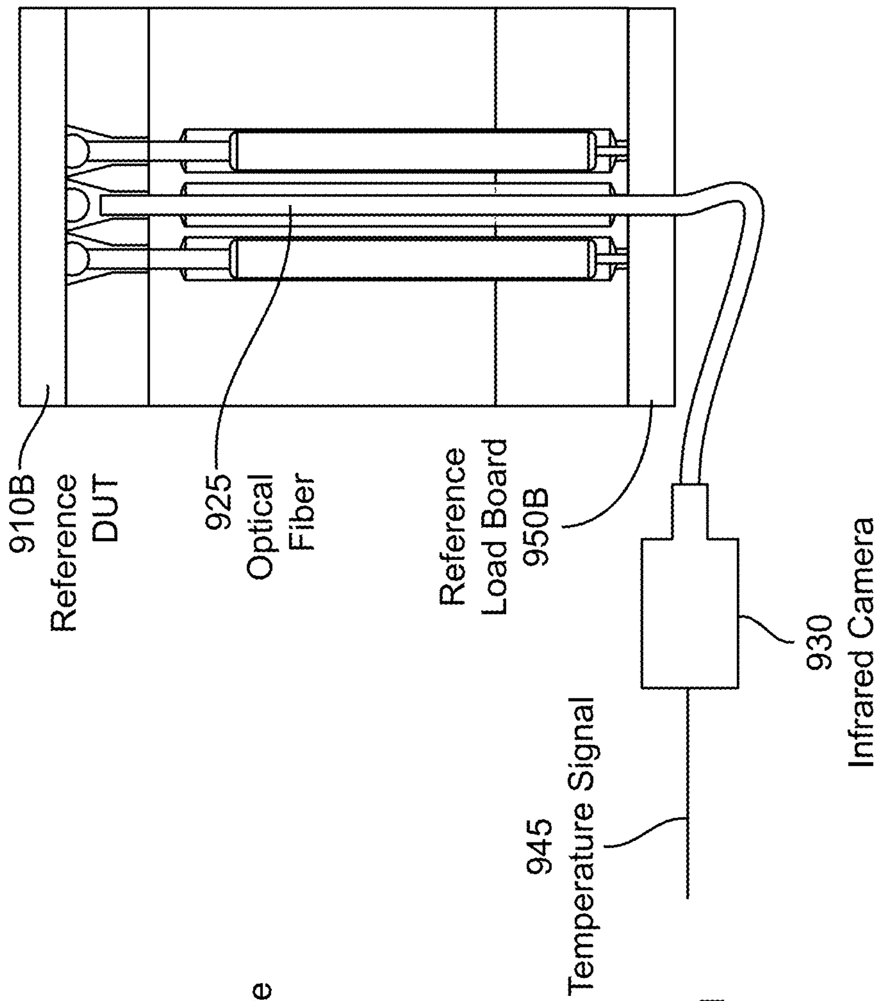
FIGS. 9A-9B illustrate techniques for measuring a temperature associated with the test socket of FIG. 2, according to various embodiments.
Figure 9A:
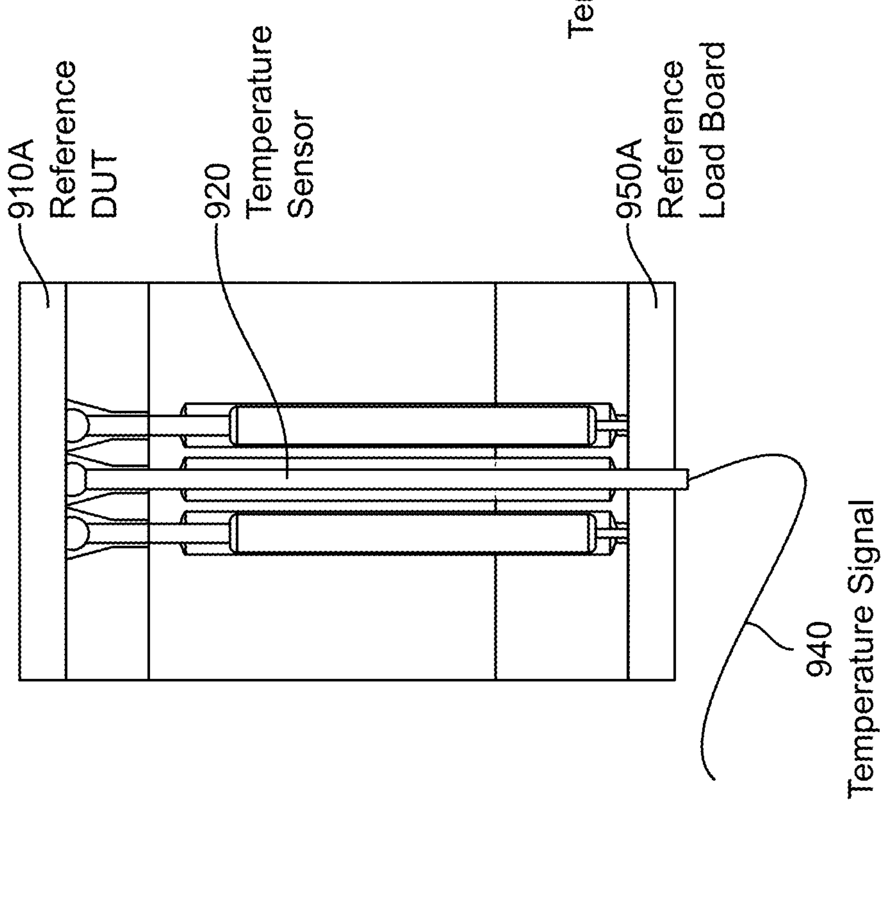

FIGS. 9A-9B illustrate techniques for measuring a temperature associated with the test socket 210 of FIG. 3, according to various embodiments. The temperature associated with the test socket 210 can be measured by any technically feasible temperature sensing device, including, without limitation, a temperature sensor proximal to the reference DUT, an optical fiber coupled to an infrared camera or a radiometric thermal camera, a temperature sensor proximal to a pedestal that is in contact with the reference DUT, and/or the like. As shown in FIG. 9A, a temperature sensor 920 replaces a spring probe of the test socket. Temperature sensor 920 can be placed under a solder ball that connects to a power pin of reference DUT 910A, a ground pin of reference DUT 910A, a signal pin of reference DUT 910A, and/or the like. Temperature sensor 920 can be placed at any location of interest, such as near an area that is known to have a relatively high temperature, a power pin or ground pin that draws a significant amount of current, an area near a circuit of interest, and/or the like. As with a spring probe, temperature sensor 920 is compressible or otherwise compliant to apply sufficient contact between a solder ball mounted to reference DUT 910A and a signal trace on reference load board 950A. To measure temperature, temperature sensor 920 can comprise a thermocouple, a resistive temperature device, and/or the like. A first end of temperature sensor 920 makes contact with, or is placed near, a solder ball mounted to reference DUT 910A or a portion of the bottom surface of reference DUT 910A. A second end of temperature sensor 920 passes through reference load board 950A and transmits a temperature signal 940. Temperature signal 940 can be combined with temperature signals from one or more other temperature measurement devices and transmitted as a combined temperature signal 240 and/or as a combined auxiliary temperature signal 245 to temperature controller 220 of FIG. 2. In some embodiments, temperature sensor 920 can be sufficiently small such that placement between adjacent spring probes is feasible. In such embodiments, temperature sensor 920 can be placed interstitially between adjacent spring probes without replacing a spring probe with temperature sensor 920.

As shown in FIG. 9B, an optical fiber 925 replaces a spring probe of the test socket. Optical fiber 925 can be placed under a solder ball that connects to a power pin of reference DUT 910B, a ground pin of reference DUT 910B, a signal pin of reference DUT 910B, and/or the like. Optical fiber 925 can be placed at any location of interest, such as near an area that is known to have a relatively high temperature, a power pin or ground pin that draws a significant amount of current, an area near a circuit of interest, and/or the like. A first end of optical fiber 925 makes contact with, or is placed near, a solder ball mounted to reference DUT 910B or a portion of the bottom surface of reference DUT 910B. Optical fiber 925 passes through reference load board 950B and a second end of optical fiber makes contact with, or is placed near, an infrared camera 930, a radiometric thermal camera, and/or other suitable imaging device. Infrared camera 930 (or other imaging device) captures or acquires an image of a solder ball and/or other portion of the bottom of reference DUT 910B. Infrared camera 930 determines a temperature value from the image via thermographic techniques and/or other similar techniques. Infrared camera 930 transmits a temperature signal 945 based on the determined temperature value. Temperature signal 945 can be combined with temperature signals from one or more other temperature measurement devices and transmitted as a combined temperature signal 240 and/or as a combined auxiliary temperature signal 245 to temperature controller 220 of FIG. 2. In some embodiments, optical fiber 925 can be sufficiently small such that placement between adjacent spring probes is feasible. In such embodiments, optical fiber 925 can be placed interstitially between adjacent spring probes without replacing a spring probe with optical fiber 925.

In some embodiments, a temperature sensor can be embedded into a pedestal of the test socket, such as pedestal 790 of test socket 705 shown in FIG. 7, pedestal 890 of test socket 805 shown in FIG. 8, and/or the like. Such a temperature sensor can comprise a thermocouple, a resistive temperature device, and/or the like. In some embodiments, temperature can be determined based on characteristics of the materials in the package of the reference DUT itself. In such embodiments, temperature controller 220 can determine temperature by measuring the voltage source and current draw from the power supply that provides power to the reference DUT. Temperature controller 220 can determine an aggregate contact resistance to detect increases due to material conductivity changes as the temperature of the materials changes. With this data, temperature controller 220 can determine the temperature based on the rate at which contact resistivity increases with temperature based on the materials used in the contacts of the reference DUT.

Figure 10:
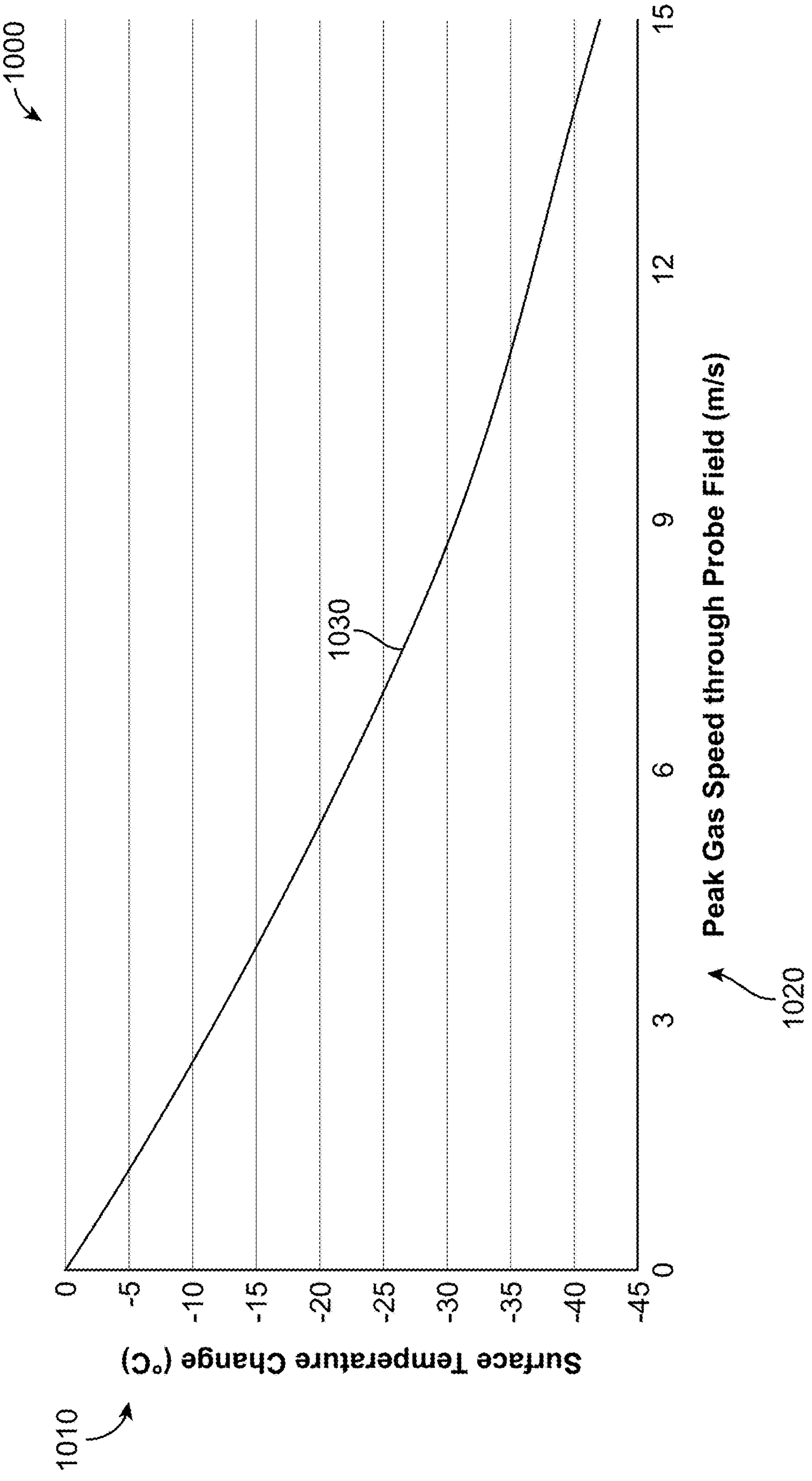
FIG. 10 is a graph that illustrates surface temperature change versus peak gas speed for the test system of FIG. 2, according to various embodiments.

FIG. 10 is a graph 1000 that illustrates surface temperature change 1010 versus peak gas speed 1020 for the test system 200 of FIG. 2, according to various embodiments. As shown, surface temperature change 1010 in degrees Celsius (° C.) increases in magnitude, or decreases in value, as peak gas speed 1020 in meters/second (m/s) in the probe field increases according to characteristic curve 1030. Characteristic curve 1030 can be determined based on any number of relevant factors, including, without limitation, the configuration and materials of a reference DUT, the configuration and materials of a test socket to which the reference DUT is mounted, the particular incoming gas used to cool the spring probes of the test socket, the temperature and humidity of the incoming gas, and/or the like.

As shown, characteristic curve 1030 indicates no surface temperature change 1010 when there is no measurable peak gas speed 1020 through the probe field (0 m/s). Characteristic curve 1030 indicates that a peak gas speed 1020 through the probe field of 3 m/s can result in a surface temperature change 1010 of approximately −12 degrees Celsius. Further, characteristic curve 1030 indicates that a peak gas speed 1020 through the probe field of 6 m/s can result in a surface temperature change 1010 of approximately-22 degrees Celsius. Characteristic curve 1030 indicates that a peak gas speed 1020 through the probe field of 9 m/s can result in a surface temperature change 1010 of approximately-31 degrees Celsius. Characteristic curve 1030 indicates that a peak gas speed 1020 through the probe field of 12 m/s can result in a surface temperature change 1010 of approximately-37 degrees Celsius. Characteristic curve 1030 indicates that a peak gas speed 1020 through the probe field of 15 m/s can result in a surface temperature change 1010 of approximately-42 degrees Celsius.

Temperature controller 220 of FIG. 2 can measure one or more temperatures associated with the reference DUT. Based on the one or more temperatures, temperature controller 220 can determine an amount of temperature change that sufficiently decreases the one or more temperatures associated with the reference DUT. More specifically, temperature controller 220 can determine an amount of temperature change that decreases the temperature of solder balls mounted to the reference DUT below the solder melting point. Temperature controller 220 can use characteristic curve 1030, and/or other suitable characteristic data, to determine a gas flow based on an amount of temperature change that sufficiently lowers the temperature of the reference DUT. Temperature controller 220 can transmit a valve control signal 260 to flow control valve 225 in order to cause flow control valve 225 to deliver gas at the determined flow rate to a test socket to which the reference DUT is mounted.

Figure 11:
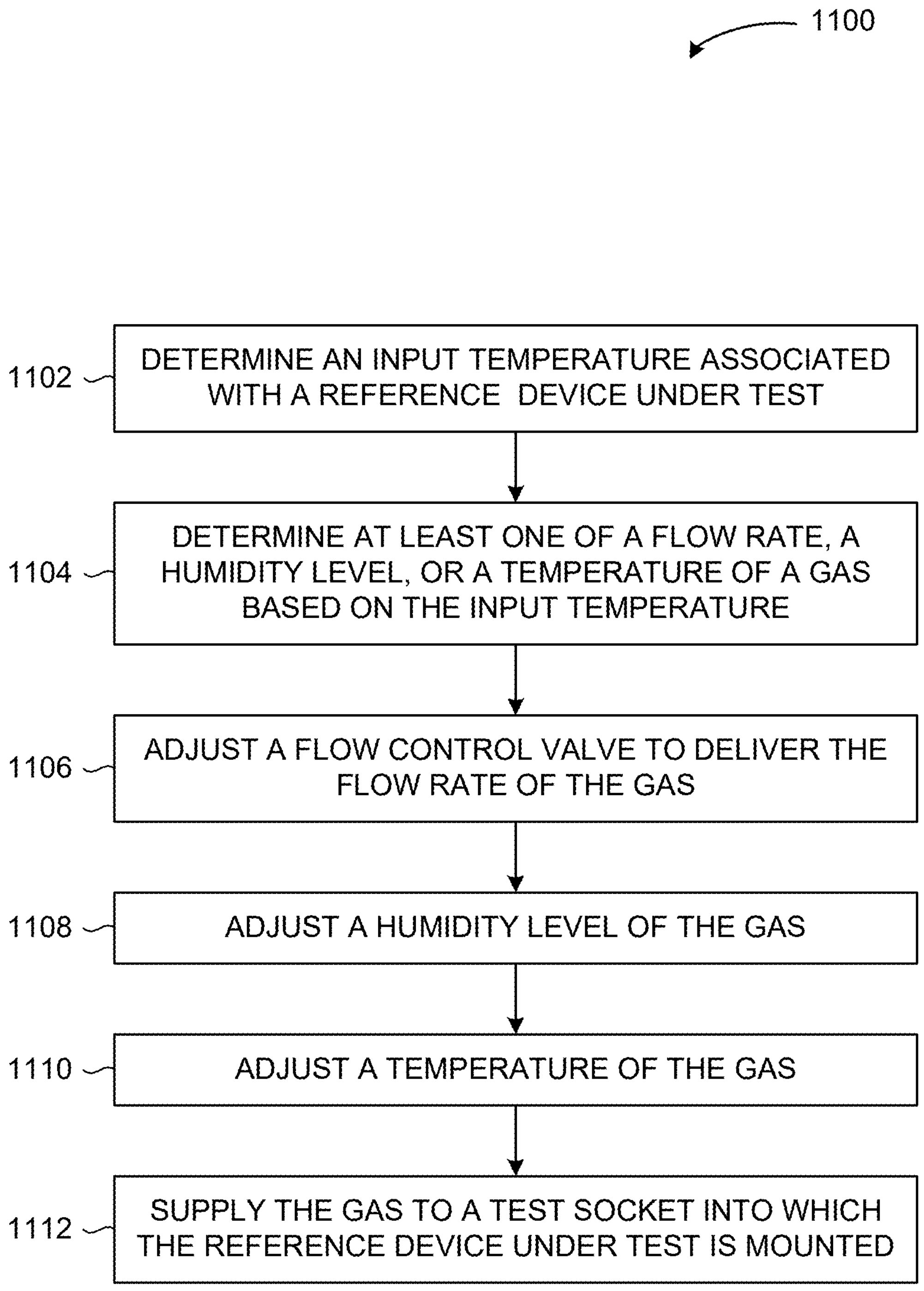
FIG. 11 is a flow diagram of methods steps for controlling temperature in an interconnect of the test socket of FIG. 3, according to various embodiments.

FIG. 11 is a flow diagram of methods steps for controlling temperature in an interconnect of the test socket 210 of FIG. 3, according to various embodiments. Although the method steps are described in conjunction with the systems of FIGS. 1-10, persons of ordinary skill in the art will understand that any system configured to perform the method steps, in any order, is within the scope of the present disclosure.

As shown, a method 1100 begins at step 1102, where a temperature controller, such as temperature controller 220 of FIG. 2, determines an input temperature associated with a reference device under test (DUT). The temperature controller receives a temperature signal from one or more temperature measurement devices included in a test socket to which the reference DUT is mounted. In some embodiments, the temperature controller can receive an auxiliary temperature signal from one or more temperature measurement devices included in a test fixture that includes the test socket. The temperature signals can be generated by any suitable temperature sensing device, including, without limitation, a temperature sensor proximal to the reference DUT, an optical fiber coupled to an infrared camera or a radiometric thermal camera, a temperature sensor proximal to a pedestal that is in contact with the reference DUT, and/or the like. Based on the temperature signal and/or the auxiliary temperature signal, the temperature controller determines an input temperature associated with the reference DUT.

At step 1104, the temperature controller determines at least one of a flow rate, a humidity level, and/or a temperature of a gas based on the input temperature determined at step 1102. The temperature controller can determine the flow rate based on a characteristic curve that defines a surface temperature change resulting from a peak gas speed of a gas flowing across spring probes in the test socket to which the reference DUT is mounted. The characteristic curve can be determined based on any number of relevant factors, including, without limitation, the configuration and materials of a reference DUT, the configuration and materials of the test socket to which the reference DUT is mounted, the particular incoming gas used to cool the spring probes of the test socket, the temperature and humidity of the incoming gas, and/or the like.

Further, the temperature controller can adjust the temperature of the gas to compensate for heat loss resulting from a thermal head that draws heat away from the reference DUT when mounted in test socket 210, to compensate for heat gain and/or heat loss caused by a reference DUT with a package-on-package (POP) configuration, and/or the like. The temperature controller can also reduce the humidity of the gas if the gas is not sufficiently dry. Similarly, the temperature controller can adjust the humidity of the gas to increase or decrease the cooling effect of the gas on the spring probes included in the test socket.

At step 1106, the temperature controller adjusts a flow control valve to deliver the flow rate of the gas. In so doing, the temperature controller transmits a valve control signal to the flow control valve. By transmitting the valve control signal to the flow control valve, the temperature controller adjusts the flow control valve to divert at least a portion of purge gas received from a test fixture and supply the portion of the gas to the test socket. The flow control valve restricts gas flow to constrict and/or control the amount of purge gas that passes through flow control valve. The flow control valve can constrict and/or control the flow of purge gas via any technically feasible mechanism for controlling gas flow, such as a solenoid, a motor, a diaphragm, a piston, a hydraulic control, and/or the like.

At step 1108, the temperature controller adjusts a humidity level of the gas. The temperature controller adjusts the humidity level by transmitting a humidity control signal to a gas conditioning module. In response, the gas conditioning module increases the humidity of the gas, decreases the humidity of the gas, or maintains the current humidity of the gas based on the humidity control signal.

At step 1110, the temperature controller adjusts a temperature of the gas. The temperature controller adjusts temperature by transmitting a humidity control signal to the gas conditioning module. In response, the gas conditioning module increases the temperature of the gas, decreases the temperature of the gas, or maintains the current temperature of the gas based on the temperature control signal.

At step 1112, the temperature controller supplies the gas to a test socket to which the reference device under test is mounted. The temperature controller supplies the gas to the test socket after adjusting the flow rate of the gas, adjusting the humidity level of the gas, and/or adjusting the temperature of the gas. In so doing, the temperature controller provides a closed loop temperature control to continuously monitor the spring probe temperature and/or DUT temperature. These adjustments maintain a flow of gas to the test socket in order to maintain a desired temperature of the solder balls mounted to the reference DUT and prevent the solder balls from melting.

In sum, the disclosed techniques include a test socket, fitted with standard spring probes, that has a modified design such that a channel is formed between the upper and lower housing of the test socket through which a gas, such as compressed dry air (CDA), flows. This channel can expose the entire field of spring probes to a stream of gas. Alternatively, a selected portion of the spring probes can be exposed to the stream of gas while other spring probes are not exposed to the stream of gas. This approach to expose only a selected portion of the spring probes to the stream of gas can be for various purposes, such as maintaining a consistent impedance along the path of the spring probes carrying high-speed signals. This test socket is designed with connection points for a gas supply, and either an exhaust port to the environment or a connection point to route the exhaust to a preferred discharge location.

One configuration can supply the gas to the test socket through alignment pins that are normally used to ensure that the thermal head and/or hand-socket lid is precisely located and seated on the test socket. Each of these alignment pins can have an axially oriented hole disposed along the main axis, and a sealing mechanism added to the alignment pins in the test socket to prevent leakage of the gas. One alignment pin can connect to the supply side of the internal socket gas flow passages while the other alignment pin can connect to the exhaust side. The discharge could also be routed to a port on the socket frame if this flow does not need to be moved away from the area. Another method can be to utilize purge gas coming in from a thermal head condensation abatement chamber, which seals around the top of the socket when the thermal head is fully engaged. CDA is supplied into this enclosed chamber and sealed volume. Further, a portion of the CDA is diverted to an inlet port in the test socket frame, also located inside the sealed area. This configuration can cause the purge gas to flow through the test socket channels and then be exhausted either directly out of a port located outside the sealed area or through tubing and one or more manifolds to other test sockets. Some embodiments provide novel ways to connect a gas supply and/or a gas exhaust to the test socket that can simplify integration into a test handler or hand-socket lid.

At least one technical advantage of the disclosed techniques relative to the prior art is that, with the disclosed techniques, a closed loop temperature control continuously monitors the spring probe temperature and/or DUT temperature and adjusts the flow of gas to a test socket that contains a reference DUT in order to maintain a desired temperature of the reference DUT. In addition, a test system can use the same spring probe as deployed in conventional systems, and avoid the need for a specially manufactured spring probe, such as a longer spring probe, that may not fit into existing test systems. Further, the disclosed solution can be fitted to and integrated with existing gas connections, test systems, and test handlers commonly found in testing environments.

These advantages represent one or more technological improvements over prior art approaches.

1. In some embodiments, a method comprises: determining an input temperature associated with a reference device under test (DUT); determining a flow rate of a gas based on the input temperature; and adjusting a flow control valve to supply the gas to the reference DUT at the flow rate.
2. The method of clause 1, wherein the gas comprises compressed dry air.
3. The method of clause one 1 or clause 2, wherein: the reference DUT is mounted to a test socket, and the gas is compressed prior to being supplied to the test socket.
4. The method of any of clauses 1-3, wherein: the reference DUT is mounted to a test socket, and the gas is exhausted from the test socket.
5. The method any of clauses 1-4, wherein: the gas is exhausted via an outlet of the test socket, and the outlet is coupled to a vacuum device.
6. The method of any of clauses 1-5, wherein: the reference DUT is mounted to a test socket, the test socket is fitted with spring probes, and the gas is supplied to the spring probes via a channel between an upper housing of the test socket and a lower housing of the test socket.
7. The method of any of clauses 1-6, wherein: the reference DUT is mounted to a test socket, and the gas is supplied to the reference DUT via a channel between a bottom surface of the reference DUT and a top surface of the test socket.
8. The method of any of clauses 1-7, wherein: the reference DUT is mounted to a test socket, and the channel exposes the gas to at least one of spring probes fitted to the test socket or solder balls coupled to the reference DUT.
9. The method of any of clauses 1-8, wherein: the reference DUT is mounted to a test socket, a first portion of a plurality of spring probes fitted to the test socket is exposed to the gas, and a second portion of the plurality of the spring probes is not exposed to the gas.
10. The method of any of clauses 1-9, wherein: the reference DUT is mounted to a test socket, and the gas is supplied to the reference DUT via a connection point comprising an inlet of the test socket.
11. The method of any of clauses 1-10, wherein: the reference DUT is mounted to a test socket, and the gas is exhausted away from the reference DUT via at least one of: an exhaust port of the test socket that exhausts the gas to a surrounding environment, or a connection point comprising an outlet of the test socket that exhausts the gas to a specified location.
12. The method of any of clauses 1-11, further comprising changing a temperature of the gas by cooling the gas and/or heating the gas prior to supplying the gas to the reference DUT.
13. The method of any of clauses 1-12, wherein: the reference DUT is mounted to a test socket, and a portion of the test socket comprises a material that has a substantially high thermal conductivity and a substantially low electrical conductivity.
14. The method of any of clauses 1-13, wherein: the reference DUT is mounted to a test socket, the gas is supplied to the reference DUT via a first alignment pin of the test socket, and the gas is exhausted away from the reference DUT via a second alignment pin of the test socket.
15. The method of any of clauses 1-14, wherein: the first alignment pin includes a first axially oriented hole through which the gas is supplied, and the second alignment pin includes a second axially oriented hole through which the gas is exhausted.
16. The method of any of clauses 1-15, wherein: the reference DUT is mounted to a test socket, and the gas is exhausted away from the reference DUT via an exhaust port on a frame of the test socket.
17. The method of any of clauses 1-16, wherein: the reference DUT is mounted to a first test socket, and the gas comprises a portion of a stream of purge gas diverted from a thermal head condensation abatement chamber that is sealed to prevent the purge gas from escaping when a thermal head of the first test socket is engaged.
18. The method of any of clauses 1-17, wherein: a second reference DUT is mounted to a second test socket, the gas is supplied via an inlet port coupled to the thermal head condensation abatement chamber, and the gas is exhausted via at least one of an outlet port coupled to the thermal head condensation abatement chamber or a conduit to the second test socket.
19. The method of any of clauses 1-18, wherein: the gas is supplied to a plurality of test sockets mounted to a test handler via a manifold system fitted with a quick disconnect, and the reference DUT is mounted to a first test socket included in the plurality of test sockets.
20. The method of any of clauses 1-19, wherein the input temperature comprises a junction temperature associated with the reference DUT.
21. The method of any of clauses 1-20, wherein determining the input temperature comprises: receiving a temperature signal from a temperature probe that is coupled to the reference DUT; and setting the input temperature based on the temperature signal.
22. The method of any of clauses 1-21, wherein determining the input temperature comprises: acquiring an image of a portion of the reference DUT; determining a temperature associated with the reference DUT from the image; and setting the input temperature based on the temperature associated with the reference DUT.
23. The method of any of clauses 1-22, wherein the image is acquired via at least one of an optical fiber that is optically coupled to the portion of the reference DUT or an infrared temperature measurement device configured to acquire the image.
24. The method of any of clauses 1-23, wherein determining the input temperature comprises: receiving a temperature signal from a temperature sensor that is coupled to a pedestal that compresses the reference DUT into a test socket; and setting the input temperature based on the temperature signal.
25. In some embodiments, a test system comprises: a test socket to which a reference device under test (DUT) is mounted; a temperature sensing device that generates a temperature signal associated with the reference DUT; and a temperature controller that: determines an input temperature associated with the reference (DUT) based on the temperature signal, determines a flow rate of a gas based on the input temperature, and adjusts a flow control valve to supply the gas to the reference DUT at the flow rate.

Any and all combinations of any of the claim elements recited in any of the claims and/or any elements described in this application, in any fashion, fall within the contemplated scope of the present disclosure and protection.

Various modules of the disclosed system can access computer readable media, and the term is known or understood to include removable media, for example, Secure Digital (SD) cards, compact discs (CDs), digital versatile disc (DVD) ROM disks, and/or the like, as well as non-removable or internal media, for example, hard disks drives (HDDs), solid state drives (SSDs), RAM, ROM, flash memory, and/or the like.

Although the disclosure has been shown and described with respect to a certain exemplary embodiment or embodiments, equivalent alterations and modifications will occur to others skilled in the art upon the reading and understanding of this specification and the annexed drawings. In particular regard to the various functions performed by the above described components (assemblies, devices, etc.) the terms (including a reference to a “means”) used to describe such components are intended to correspond, unless otherwise indicated, to any component which performs the specified function of the described component (e.g., that is functionally equivalent), even though not structurally equivalent to the disclosed structure which performs the function in the herein illustrated exemplary embodiments of the disclosure. In addition, while a particular feature of the disclosure may have been disclosed with respect to only one of several embodiments, such feature may be combined with one or more features of the other embodiments as may be desired and advantageous for any given or particular application. Persons of ordinary skill in the art will appreciate that the architecture described in the figures in no way limits the scope of the various embodiments of the present disclosure.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a “module,” a “system,” or a “computer.” In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, field-programmable gate arrays, and/or the like.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A method, comprising:

determining an input temperature associated with a reference device under test (DUT);

determining a flow rate of a gas based on the input temperature;

adjusting a flow control valve to supply the gas to the reference DUT at the flow rate, wherein the reference DUT is mounted to a test socket; and supplying the gas to spring probes via a channel between an upper housing of the test socket and a lower housing of the test socket, wherein the test socket is fitted with the spring probes.

2. The method of claim 1, wherein the gas comprises compressed dry air.

3. The method of claim 1, wherein:

the reference DUT is mounted to a test socket, and the gas is compressed prior to being supplied to the test socket.

4. The method of claim 1, wherein:
the reference DUT is mounted to a test socket, and
the gas is exhausted from the test socket.

5. The method of claim 4, wherein:
the gas is exhausted via an outlet of the test socket, and the outlet is coupled to a vacuum device.

6. The method of claim 1, wherein:
the reference DUT is mounted to a test socket, and
the gas is supplied to the reference DUT via a channel between a bottom surface of the reference DUT and a top surface of the test socket.

7. The method of claim 6, wherein:
the reference DUT is mounted to a test socket, and
the channel exposes the gas to at least one of spring probes fitted to the test socket or solder balls coupled to the reference DUT.

8. The method of claim 1, wherein:
the reference DUT is mounted to a test socket,
a first portion of a plurality of spring probes fitted to the test socket is exposed to the gas, and
a second portion of the plurality of the spring probes is not exposed to the gas.

9. The method of claim 1, wherein:
the reference DUT is mounted to a test socket, and
the gas is supplied to the reference DUT via a connection point comprising an inlet of the test socket.

10. The method of claim 1, wherein:
the reference DUT is mounted to a test socket, and
the gas is exhausted away from the reference DUT via at least one of:
an exhaust port of the test socket that exhausts the gas to a surrounding environment, or
a connection point comprising an outlet of the test socket that exhausts the gas to a specified location.

11. The method of claim 1, further comprising changing a temperature of the gas by cooling the gas and/or heating the gas prior to supplying the gas to the reference DUT.

12. The method of claim 1, wherein:
the reference DUT is mounted to a test socket, and
a portion of the test socket comprises a material that has a thermal conductivity greater than 10 watts per meter Kelvin (W/m*K) and an electrical conductivity less than 10e-6 microsiemens per centimeter (µS/cm).

13. A method, comprising:
determining an input temperature associated with a reference device under test (DUT);
determining a flow rate of a gas based on the input temperature;
adjusting a flow control valve to supply the gas to the reference DUT at the flow rate, wherein the reference DUT is mounted to a test socket;
supplying the gas to the reference DUT via a first alignment pin of the test socket; and
exhausting the gas away from the reference DUT via a second alignment pin of the test socket.

14. The method of claim 13, wherein:
the first alignment pin includes a first axially oriented hole through which the gas is supplied, and
the second alignment pin includes a second axially oriented hole through which the gas is exhausted.

15. The method of claim 1, wherein:
the reference DUT is mounted to a test socket, and
the gas is exhausted away from the reference DUT via an exhaust port on a frame of the test socket.

16. A method, comprising:
determining an input temperature associated with a reference device under test (DUT);
determining a flow rate of a gas based on the input temperature;
adjusting a flow control valve to supply the gas to the reference DUT at the flow rate, wherein the reference DUT is mounted to a first test socket; and
diverting a portion of a stream of purge gas included with the gas from a thermal head condensation abatement chamber that is sealed to prevent the portion of the stream of purge gas from escaping when a thermal head of the first test socket is engaged.

17. The method of claim 16, wherein:
a second reference DUT is mounted to a second test socket,
the gas is supplied via an inlet port coupled to the thermal head condensation abatement chamber, and
the gas is exhausted via at least one of an outlet port coupled to the thermal head condensation abatement chamber or a conduit to the second test socket.

18. The method of claim 16, wherein:
the gas is supplied to a plurality of test sockets mounted to a test handler via a manifold system fitted with a quick disconnect, and
the reference DUT is mounted to a first test socket included in the plurality of test sockets.

19. The method of claim 1, wherein the input temperature comprises a junction temperature associated with the reference DUT.

20. The method of claim 1, wherein determining the input temperature comprises:
receiving a temperature signal from a temperature probe that is coupled to the reference DUT; and
setting the input temperature based on the temperature signal.

21. The method of claim 1, wherein determining the input temperature comprises:
acquiring an image of a portion of the reference DUT;
determining a temperature associated with the reference DUT from the image; and
setting the input temperature based on the temperature associated with the reference DUT.

22. The method of claim 21, wherein the image is acquired via at least one of an optical fiber that is optically coupled to the portion of the reference DUT or an infrared temperature measurement device configured to acquire the image.

23. The method of claim 1, wherein determining the input temperature comprises:
receiving a temperature signal from a temperature sensor that is coupled to a pedestal that compresses the reference DUT into a test socket; and
setting the input temperature based on the temperature signal.

* * * * *